(12) United States Patent
Liao

(10) Patent No.: US 11,024,676 B2
(45) Date of Patent: Jun. 1, 2021

(54) ORGANIC LIGHT-EMITTING DIODE DISPLAY PANEL AND MANUFACTURING METHOD THEREOF, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventor: Chin Lung Liao, Beijing (CN)

(73) Assignees: Hefei Xinsheng Optoelectroncs Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/459,850

(22) Filed: Jul. 2, 2019

(65) Prior Publication Data
US 2020/0006440 A1 Jan. 2, 2020

(30) Foreign Application Priority Data
Jul. 2, 2018 (CN) .......................... 201810707542.0

(51) Int. Cl.
*H01L 27/32* (2006.01)
*H01L 51/52* (2006.01)
*H01L 51/56* (2006.01)

(52) U.S. Cl.
CPC ...... *H01L 27/3211* (2013.01); *H01L 51/5203* (2013.01); *H01L 51/56* (2013.01)

(58) Field of Classification Search
CPC ... H01L 27/3211–3218; H01L 27/3246; H01L 51/5203; H01L 51/5209; H01L 51/5225
See application file for complete search history.

(56) References Cited

U.S. PATENT DOCUMENTS

| | | | |
|---|---|---|---|
| 6,566,156 B1 * | 5/2003 | Sturm | H01L 27/3211 438/35 |
| 2007/0046185 A1 | 3/2007 | Kim | |
| 2014/0191202 A1 * | 7/2014 | Shim | H01L 51/5265 257/40 |
| 2014/0218701 A1 | 8/2014 | Nishioka | |
| 2016/0329385 A1 * | 11/2016 | Qiu | H01L 27/3218 |
| 2017/0365646 A1 * | 12/2017 | Bai | H01L 51/5225 |

FOREIGN PATENT DOCUMENTS

| | | |
|---|---|---|
| CN | 1921140 A | 2/2007 |
| CN | 103364998 A | 10/2013 |

OTHER PUBLICATIONS

First office action of Chinese application No. 201810707542.0 dated Mar. 5, 2020.

* cited by examiner

*Primary Examiner* — Zandra V Smith
*Assistant Examiner* — Molly K Reida
(74) *Attorney, Agent, or Firm* — Fay Sharpe LLP

(57) ABSTRACT

Provided are an organic light-emitting diode display panel and a manufacturing method thereof, and a display device, in the field of display technology. The OLED display panel includes: a base substrate and plurality of light-emitting units. Each light-emitting unit includes a first electrode, a second electrode, and a light-emitting layer between the first electrode and the second electrode, and a ratio of areas of light-emitting layers in the plurality of light-emitting units is within a threshold range.

15 Claims, 7 Drawing Sheets

ORGANIC LIGHT-EMITTING DIODE DISPLAY PANEL AND MANUFACTURING METHOD THEREOF, AND DISPLAY DEVICE

CROSS-REFERENCE TO RELATED APPLICATION

This application claims priority to Chinese Patent Application No. 201810707542.0 filed on Jul. 2, 2018 and entitled "ORGANIC LIGHT-EMITTING DIODE DISPLAY PANEL AND MANUFACTURING METHOD THEREOF, AND DISPLAY DEVICE", the entire contents of which are incorporated herein by reference.

TECHNICAL FIELD

The present disclosure relates to the field of display technology, and in particular to an organic light-emitting diode display panel and a manufacturing method thereof, and a display device.

BACKGROUND

An organic light-emitting diode (OLED) display panel is a self-luminous display panel and has advantages of fast response, wide viewing angle, high brightness, colorfulness, lightness, thinness, and the like.

In the related arts, an OLED display panel includes a base substrate and a plurality of light-emitting units disposed on the base substrate. Each light-emitting unit includes two electrodes and a light-emitting layer disposed between the two electrodes. An overlapping region of orthographic projections of the two electrodes on the base substrate overlaps with an orthographic projection of the light-emitting layer on the base substrate, to drive the light-emitting layer to emit light. Areas of the light-emitting layers of different light-emitting units are different as sensitivities of human eyes to different color light are different.

SUMMARY

Embodiments of the present disclosure provide an organic light-emitting diode display panel and a manufacturing method thereof, and a display device. The technical solutions are as follows.

In an aspect of the present disclosure, there is provided an organic light-emitting diode display panel, comprising: a base substrate, and plurality of light-emitting units; wherein the plurality of light-emitting units are on the base substrate; each of the light-emitting units comprises a first electrode, a second electrode, and a light-emitting layer between the first electrode and the second electrode; a ratio of areas of light-emitting layers in the plurality of light-emitting units is within a threshold range; and an electrode overlapping region exists between an orthographic projection of the first electrode on the base substrate and an orthographic projection of the second electrode on the base substrate, and electrode overlapping region is within an orthographic projection of the light-emitting layer on the base substrate.

Optionally, the base substrate comprises a plurality of pixel regions, and each of the pixel regions comprises at least two sub-pixel regions, each of which has the light-emitting unit.

Optionally, each of the pixel region comprises three sub-pixel regions, wherein a blue light-emitting unit configured to emit blue light, a green light-emitting unit configured to emit green light, and a red light-emitting unit configured to emit red light are disposed in the three sub-pixel regions, respectively; wherein an area of an electrode overlapping region of the green light-emitting unit is smaller than an area of a light-emitting layer in the green light-emitting unit; an area of an electrode overlapping region of the blue light-emitting unit is equal to an area of a light-emitting layer in the blue light-emitting unit; and an area of an electrode overlapping region of the red light-emitting unit is smaller than an area of a light-emitting layer in the red light-emitting unit.

Optionally, the area of the electrode overlapping region of the green light-emitting unit is greater than the area of the electrode overlapping region of the red light-emitting unit.

Optionally, each of the pixel regions comprises four sub-pixel regions, a green light-emitting unit configured to emit green light, a red light-emitting unit configured to emit red light, and two blue light-emitting units configured to emit blue light are disposed in the four sub-pixel regions, respectively.

Optionally, the base substrate comprises a plurality of groups of pixel regions, and each group of pixel regions comprises adjacent two pixel regions, wherein each of the two pixel regions has a green light-emitting unit configured to emit green light and a blue light-emitting unit configured to emit blue light; and a red light-emitting unit configured to emit red light is further disposed in the two pixel regions, wherein the red light-emitting unit comprises two red light-emitting sub-units in the two pixel regions, respectively, and light-emitting layers in the two red light-emitting sub-units directly contact with each other.

Optionally, areas of light-emitting layers in at least two of the plurality of light-emitting units in the organic light-emitting diode display panel are equal.

Optionally, the organic light-emitting diode display panel further comprises: a pixel defining layer, wherein the pixel defining layer is on the base substrate, and defines at least two sub-pixel regions having an equal area on the base substrate; and the light-emitting layers of the plurality of light-emitting units are in the at least two sub-pixel regions having the equal area in a one-to-one correspondence manner.

Optionally, the first electrodes of the plurality of light-emitting units directly contact with each other.

Optionally, the second electrodes of the plurality of light-emitting units are of an integrated structure.

Optionally, at least one kind of the first electrodes and second electrodes of the plurality of light-emitting units are made of a transparent conductive material.

Optionally, each of the plurality of light-emitting units corresponds to a designated light-emitting area, and an electrode overlapping area of any one light-emitting unit of the plurality of light-emitting units is equal to the designated light-emitting area that the any one light-emitting unit corresponds to.

Optionally, the threshold range is [0.65, 1.35].

Optionally, wherein the base substrate comprises a plurality of pixel regions; and each of the pixel regions comprises at least two sub-pixel regions, each of which has the light-emitting unit; the base substrate comprises a plurality of groups of pixel regions, and each group of pixel regions comprises adjacent two pixel regions, wherein each of the two pixel regions has a green light-emitting unit configured to emit green light and two blue light-emitting units configured to emit blue light; a red light-emitting unit configured to emit red light is further disposed in the two pixel regions, wherein the red light-emitting unit comprises two red light-emitting sub-units in the two pixel regions, respectively, and light-emitting layers in the two red light-emitting sub-units directly contact with each other; areas of the light-emitting layers in the at least two of the plurality of light-emitting units in the organic light-emitting diode display panel are equal;

the organic light-emitting diode display panel further comprises a pixel defining layer, wherein the pixel defining layer is on the base substrate and defines at least two sub-pixel regions having an equal area on the base substrate, and the light-emitting layers of the plurality of light-emitting units are in the at least two sub-pixel regions having the equal area in a one-to-one correspondence manner; the first electrodes of the plurality of light-emitting units directly contact with each other; at least one kind of the first electrodes and second electrodes of the plurality of light-emitting units are made of a transparent conductive material; and each of the plurality of light-emitting units corresponds to a designated light-emitting area, and an electrode overlapping area of any one light-emitting unit of the plurality of light-emitting units is equal to the designated light-emitting area that the any one light-emitting unit corresponds to.

In another aspect of the present disclosure, there is provided a manufacturing method of an organic light-emitting diode display panel, comprising: providing a base substrate; and forming a plurality of light-emitting units on the base substrate, wherein each of the light-emitting units comprises a first electrode, a second electrode, and a light-emitting layer formed between the first electrode and the second electrode, a ratio of areas of the light-emitting layers in the plurality of light-emitting units is within a threshold range, and an electrode overlapping region exists between an orthographic projection of the first electrode on the base substrate and an orthographic projection of the second electrode on the base substrate, and the electrode overlapping region is within an orthographic projection of the light-emitting layer on the base substrate.

Optionally, forming a plurality of light-emitting units on the base substrate comprises: forming at least two first electrodes on the base substrate; forming a pixel defining layer on the base substrate on which the at least two first electrodes are formed, wherein the pixel defining layer defines at least two sub-pixel regions having an equal area on the base substrate; forming light-emitting layers of the plurality of light-emitting units on the base substrate on which the pixel defining layer is formed, wherein the light-emitting layers of the plurality of light-emitting units are formed in the at least two sub-pixel regions having the equal area in a one-to-one correspondence manner; and forming at least two second electrodes on the base substrate on which the light-emitting layers are formed.

Optionally, forming the at least two first electrodes on the base substrate comprises: forming an electrode layer on the base substrate, wherein the electrode layer forms the at least two first electrodes.

Optionally, forming the light-emitting layers of the plurality of light-emitting units on the base substrate on which the pixel defining layer is formed comprises: forming the light-emitting layers of the plurality of light-emitting units on the base substrate on which the pixel defining layer is formed by using the ink-jet printing technology.

In yet another aspect of the present disclosure, there is provided a display device, comprising an organic light-emitting diode display panel, wherein the organic light-emitting diode display panel comprises: a base substrate; and a plurality of light-emitting units; wherein the plurality of light-emitting units are on the base substrate; each of the light-emitting units comprises a first electrode, a second electrode, and a light-emitting layer between the first electrode and the second electrode; a ratio of areas of the light-emitting layers in the plurality of light-emitting units is within a threshold range; and an electrode overlapping region exists between an orthographic projection of the first electrode on the base substrate and an orthographic projection of the second electrode on the base substrate, and the electrode overlapping region is in an orthographic projection of the light-emitting layer on the base substrate.

Optionally, in the organic light-emitting diode display panel, the base substrate comprises a plurality of pixel regions; and each of the pixel regions comprises at least two sub-pixel regions, each of which has the light-emitting unit; the base substrate comprises a plurality of groups of pixel regions, and each group of pixel regions comprises adjacent two pixel regions, each of which has a green light-emitting unit configured to emit green light and two blue light-emitting units configured to emit blue light; a red light-emitting unit configured to emit red light is further disposed in the two pixel regions, wherein the red light-emitting unit comprises two red light-emitting sub-units in the two pixel regions, respectively, and light-emitting layers in the two red light-emitting sub-units directly contact with each other; areas of light-emitting layers in the at least two of the plurality of light-emitting units in the organic light-emitting diode display panel are equal; the organic light-emitting diode display panel further comprises a pixel defining layer, wherein the pixel defining layer is on the base substrate and defines at least two sub-pixel regions having an equal area on the base substrate, and the light-emitting layers of the plurality of light-emitting units are in the at least two sub-pixel regions having the equal area in a one-to-one correspondence manner; the first electrodes of the plurality of light-emitting units directly contact with each other; and at least one kind of the first electrodes and second electrodes of the plurality of light-emitting units are made of a transparent conductive material.

DETAILED DESCRIPTION

Figure 1:
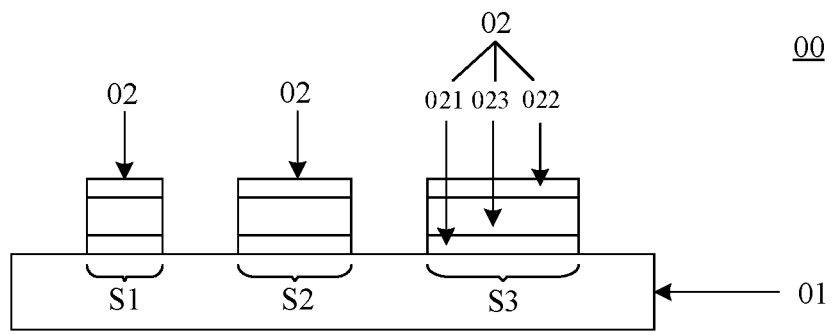
FIG. 1 is a schematic diagram of a partial structure of an OLED display panel provided in the related art.

Embodiments of the present disclosure will be described below with reference to the accompanying drawings.

Generally, a light-emitting layer in an OLED display panel is made of an electroluminescent material. At present, technologies for manufacturing the light-emitting layer in an OLED display panel may include vacuum evaporation technology and solution processing technology. The solution processing technology may include spin coating technology, ink-jet printing technology, nozzle coating technology, and the like. The solution of electroluminescent material may be sprayed onto regions where the light-emitting layers are to be formed by using the ink-jet printing technology. After the solution dries and solidifies, light-emitting layers capable of emitting different color light are formed. The uniformity of the light-emitting layers determines the uniformity of light emitted by the light-emitting layers.

When light-emitting layers of light-emitting units configured to emit different color light are formed, considering that human eyes have different sensitivities to different color light (for example, human eyes are more sensitive to red light and green light than blue light), different designated light-emitting areas (the designated light-emitting area is a pre-designed actual light-emitting area of the light-emitting layer in each light-emitting unit) may be predetermined for the light-emitting units emitting different color lights according to the sensitivities of human eyes to different color lights. For example, it can be designed that the designated light-emitting area of the light-emitting unit emitting blue light is bigger, and the designated light-emitting areas of the light-emitting units emitting green light and red light are smaller.

In order to better understand the difference between the OLED display panel described in the embodiments of the present disclosure and the OLED display panel described in the related art, the light-emitting principle of the OLED display panel is briefly introduced first. The OLED display panel includes a plurality of light-emitting units disposed on a base substrate, and each light-emitting unit includes two electrodes and a light-emitting layer disposed between the two electrodes.

An electron transport layer and a hole transport layer may be further disposed in the light-emitting unit, and one of the electron transport layer and hole transport layer may be between one of the two electrodes and the light-emitting layer and the other one of the electron transport layer and hole transport layer is between the other on one of the two electrodes and the light-emitting layer. Alternatively, the two electrodes may include the electron transport layer and the hole transport layer, respectively. Alternatively, the light-emitting layer may include an electroluminescent material layer and the electron transport layer and the hole transport layer which are disposed on two sides of the electroluminescent material layer. After voltage is applied to the electrodes on two sides of the light-emitting layer, electrons and holes are injected from the electron transport layer and the hole transport layer respectively to the electroluminescent material in the light-emitting layer, and the electrons release energy when meeting the holes, to cause the electroluminescent material to emit light. The manner and principle of driving the light-emitting layer may be made reference to the related art, and details will not be repeated herein.

FIG. 1 is a schematic diagram of a partial structure of an OLED display panel 00 which includes a base substrate 01, and three light-emitting units 02 disposed on the base substrate 01. The OLED display panel 00 may include a plurality of light-emitting units 02, and only three light-emitting units 02 are illustrated as an example in FIG. 1. Each light-emitting unit 02 includes a first electrode 021, a second electrode 022, and a light-emitting layer 023 disposed between the two electrodes. An overlapping region (this overlapping region can be regarded as an orthographic projection region of the region where the two electrodes are relatively overlapped on the base substrate. As voltage only exists between the region where the two electrodes are relatively overlapped, the light-emitting layer whose orthographic projection on the base substrate is within the overlapping region is the light-emitting layer that is actually driven by the two electrodes, and an area, corresponding to the overlapping region, in the light-emitting layer is a designated light-emitting area) of orthographic projections of the two electrodes in each light-emitting unit 02 on the base substrate 01 overlaps with an orthographic projection of the light-emitting layer 023 in the light-emitting unit on the base substrate. That is, the entire light-emitting layer is driven by the two electrodes to emit light.

FIG. 1 shows overlapping regions of three sizes, namely S1, S2, and S3, respectively. The areas of the overlapping regions of three sizes are equal to the designated light-emitting areas of the three light-emitting units 02, respectively. The first electrode 021 and the second electrode 022 in each light-emitting unit may apply voltage to the light-emitting layer 023 between the two electrodes, to drive the light-emitting layer 023 to emit light. In a current OLED display panel, the designated light-emitting area in a light-emitting unit and the area (the area of the light-emitting layer may be equal to the area of the orthographic projection of the light-emitting layer on the base substrate) of the light-emitting layer in the light-emitting unit are the same, so that areas of the light-emitting layers in the light-emitting units emitting different color light are different.

Figure 2:
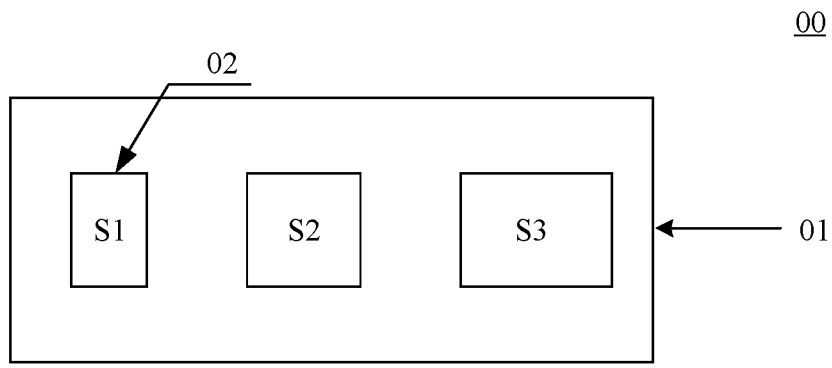
FIG. 2 is a schematic diagram of a top view structure of the OLED display panel shown in FIG. 1.

Please refer to FIG. 2, it shows a schematic diagram of a top view structure of the OLED display panel 00 shown in FIG. 1. It can be seen from FIG. 2 that areas of the light-emitting layers in the light-emitting units emitting different color lights are different. The reference numerals of the respective structures in FIG. 2 may be made reference to those of the respective structures in FIG. 1, and details will not be repeated herein.

When light-emitting layers of the light-emitting units configured to emit different color light are formed, as the areas of the light-emitting layers of the light-emitting units emitting different color light are different, the volatilization speed of different light-emitting layers is different. In this situation, the uniformity of the light-emitting layers in the light-emitting units emitting different color light is poorer, causing poorer uniformity of light emitted by the light-emitting units emitting different color light.

Embodiments of the present disclosure provide an OLED display panel and a manufacturing method thereof, and a display device, which can solve the problems in the related art.

Figure 3:
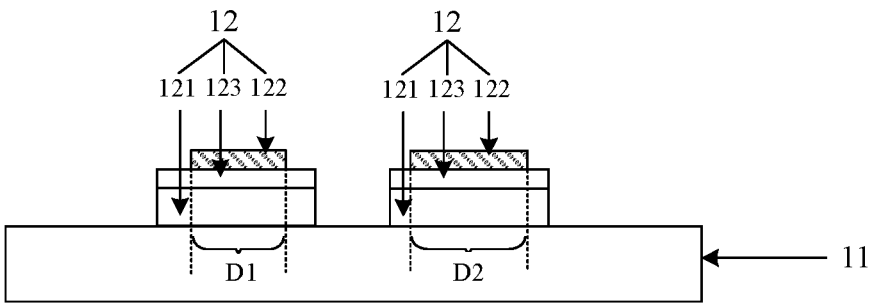
FIG. 3 is a schematic diagram of a partial structure of an OLED display panel provided in an embodiment of the present disclosure.

FIG. 3 is a schematic diagram of a partial structure of an OLED display panel 10 provided in an embodiment of the present disclosure. The OLED display panel 10 includes a base substrate 11, and plurality of light-emitting units 12 on the base substrate 11. Description is given in FIG. 3 by taking an example in which two light-emitting units 12 are disposed on the base substrate 11.

Here, each light-emitting unit 12 includes a first electrode 121, a second electrode 122, and a light-emitting layer 123 disposed between the first electrode 121 and the second electrode 122. A ratio of areas of the light-emitting layer 123 in at least two of the plurality of light-emitting units 12 is within a threshold range (The threshold range may be preset according to design requirements). That is, the difference between the areas of the light-emitting layers in the light-emitting units on the base substrate 11 is small.

An electrode overlapping region exists between an orthographic projection of the first electrode 121 on the base substrate 11 and an orthographic projection of the second electrode 122 on the base substrate 11. In the embodiments of the present disclosure, the electrode overlapping region is within the orthographic projection of the light-emitting layer 123 on the base substrate 11. The region where the orthographic projection of the electrode overlapping region on the light-emitting layer is within is the light-emitting region of the light-emitting layer driven by the two electrodes.

Here, the first electrode 121 and the second electrode 122 may serve as a cathode and an anode of the light-emitting unit, respectively.

In summary, the embodiment of the present disclosure provides an OLED display panel. It is ensured that the light-emitting layers in the light-emitting units have similar volatilization speed by enabling the areas of the light-emitting layers in any two light-emitting units to be approximate. Thus, the present disclosure solves the problem in the related art that the uniformity of the light-emitting layers in the light-emitting units emitting the different color light is poorer due to different volatilization speed of the different light-emitting layers, to cause poor uniformity of light emitted by the light-emitting units emitting different color light, and improves the uniformity of the light-emitting layers in the light-emitting units emitting different color light, thereby improving the uniformity of light emitted by the light-emitting units emitting different color light.

Optionally, the threshold range may be [0.65, 1.35].

Optionally, the ratio of the areas of the light-emitting layers in any two of the plurality of light-emitting units is from 0.65 to 1.35.

Optionally, the areas of the light-emitting layers in at least two of the plurality of light-emitting units on the base substrate may be equal.

Optionally, the ratio of the areas of the light-emitting layers in any two of the plurality of light-emitting units may be 1. In this way, it can ensure that the volatilization speed of the light-emitting layers in all light-emitting units are the same, which further ensures the uniformity of the light-emitting layers in the light-emitting units emitting different color light, and the uniformity of light emitted by the light-emitting units emitting different color light. The equality of the areas is not limited to absolute equality, but is the equality where an error is allowed.

In the embodiment shown in FIG. 3, in the light-emitting unit 12 on the left side of FIG. 3, an electrode overlapping region D1 exists between the orthographic projection of the first electrode 121 on the base substrate 11 and the orthographic projection of the second electrode 122 on the base substrate 11. The area of the electrode overlapping region D1 is equal to the designated light-emitting area of each light-emitting unit 12, and is smaller than the area of the light-emitting layer 123 in the light-emitting unit 12 on the left side. Similarly, in the light-emitting unit 12 on the right side of FIG. 3, there is an electrode overlapping region D2. The electrode overlapping region D1 in the light-emitting unit 12 on the left side and the electrode overlapping region D2 in the light-emitting unit 12 on the right side may be of different sizes. The light-emitting unit 12 on the left side and the light-emitting unit 12 on the right side in FIG. 3 may be light-emitting units configured to emit different color light.

It can be seen from FIG. 3 that although the areas of the electrode overlapping regions D1 and D2 in the two light-emitting units 12 are different, the areas of the light-emitting layers 123 in the two light-emitting units 12 are approximately equal. Thus, it is ensured that the light-emitting layers 123 in the two light-emitting units 12 have similar volatilization speed, so that the forms of the light-emitting layers 123 finally formed are uniform, thereby ensuring the uniformity of light emitted by the light-emitting units emitting different color light.

Of course, in other embodiments, there may be a plurality of light-emitting units on the base substrate, which is not be repeated in the embodiments of the present disclosure.

Figure 4:
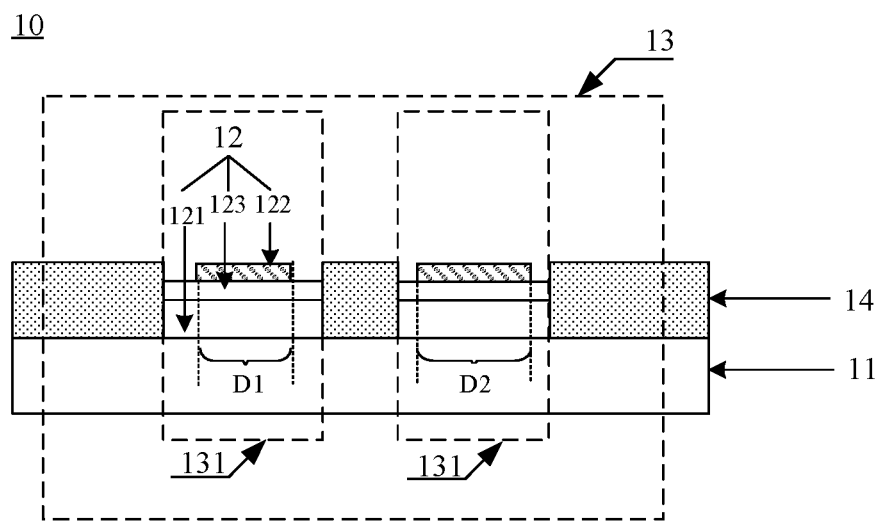
FIG. 4 is a schematic diagram of a structure of another OLED display panel provided by an embodiment of the present disclosure.

Optionally, FIG. 4 is a schematic diagram of a structure of yet another display panel provided in an embodiment of the present disclosure. Here, the base substrate 11 may include a plurality of pixel regions 13, each of which may include at least two sub-pixel regions 131. Each sub-pixel region 131 is provided with a light-emitting unit 12. FIG. 4 shows an example in which the base substrate 11 includes one pixel region 13 and the pixel region 13 includes two sub-pixel regions 131.

There may be multiple ways of defining the sub-pixel regions 131 in each pixel region 13. In one way, a pixel defining layer is adopted for defining. The OLED display panel provided in the embodiment of the present disclosure may include a pixel defining layer 14 on the base substrate 11. A plurality of sub-pixel regions 131 may be defined through the pixel defining layer 14. In FIG. 4, the pixel defining layer 14 may define at least two sub-pixel regions 131 having the equal area (or the ratio of the areas is within the threshold range) on the base substrate 11, and the light-emitting layers in the plurality of light-emitting units 12 may be disposed in at least two sub-pixel regions 131 having the equal area in a one-to-one correspondence manner.

Figure 5:
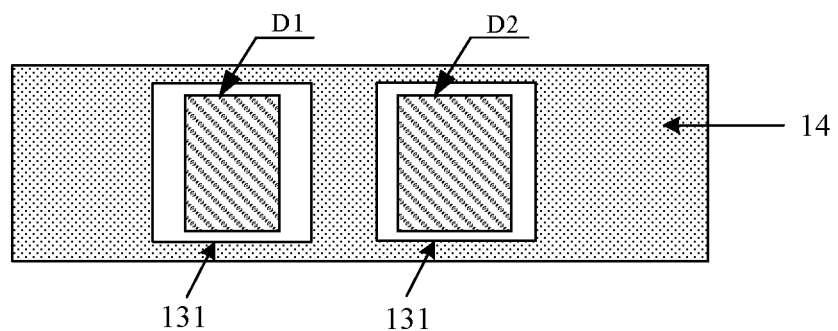
FIG. 5 is a schematic diagram of a top view structure of the OLED display panel shown in FIG. 4.

FIG. 5 is a schematic diagram of a top view structure of the OLED display panel shown in FIG. 4. As can be seen from FIG. 5, a pixel defining layer 14 is disposed on the base substrate, and the pixel defining layer 14 defines two sub-pixel regions 131 having the equal size. The two sub-pixel regions 131 include an electrode overlapping region D1 and an electrode overlapping region D2, respectively. The electrode overlapping regions D1 and D2 are two regions with different areas. The two regions may be electrode overlapping regions in the light-emitting units configured to emit different color light. Optionally, the pixel defining layer 14 may include a plurality of opening regions, each of which may define one sub-pixel region.

Optionally, each pixel region in the OLED display panel includes a light-emitting unit configured to emit blue light, a light-emitting unit configured to emit green light, and a light-emitting unit configured to emit red light. As human eyes are generally less sensitive to the blue light than to green light, and less sensitive to the green light than to red light, in order to relatively balance different color light emitted by the plurality of light-emitting units in each pixel region in the human eyes, designated light-emitting areas of the light-emitting units configured to emit different color light in each pixel region may be enabled to satisfy the following condition: the total designated light-emitting area emitting red light< the total designated light-emitting area emitting green light< the total designated light-emitting area emitting blue light.

Here, in each pixel region, the total designated light-emitting area configured to emit certain color light may be the sum of designated light-emitting areas of all light-emitting units configured to emit this color light in each pixel region. Of course, in some embodiments of the present disclosure, the designated light-emitting areas emitting blue light, green light and red light may be adjusted according to the color vision effect (for example, if the display panel is expected to display a reddish color, the designated light-emitting area of the red light-emitting unit can be increased relatively) to be displayed by the OLED display panel, and details are repeated herein.

The OLED display panel provided in the embodiments of the present disclosure may include the following three structures according to the condition satisfied by the designated light-emitting areas configured to emit different color light.

Figure 6:
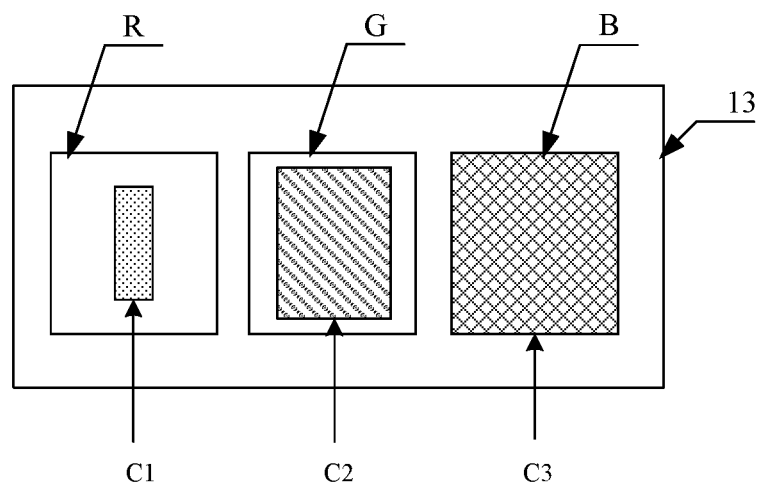
FIG. 6 is a schematic diagram of a structure of an OLED display panel according to an embodiment of the present disclosure.

In the first structure, as shown in FIG. 6, a blue light-emitting unit B configured to emit blue light, a green light-emitting unit G configured to emit green light, and a red light-emitting unit R configured to emit red light are disposed in the three sub-pixel regions included in the pixel region 13, respectively. The area of the light-emitting layer in each light-emitting unit may be equal to the designated light-emitting area of the blue light-emitting unit B configured to emit blue light (or the ratio of the areas is within the above threshold range), so that an area of the electrode overlapping region C3 (The electrode overlapping region is the electrode overlapping region between the orthographic projections of the two electrodes on the base substrate) in the blue light-emitting unit B is equal to the area of the light-emitting layer in the blue light-emitting unit B. As the human eyes are generally more sensitive to red light and green light than to blue light, the area of the electrode overlapping region C2 of the green light-emitting unit G is smaller than the area of the light-emitting layer in the green light-emitting unit G, and the area of the electrode overlapping region C1 of the red light-emitting unit R is smaller than the area of the light-emitting layer in the red light-emitting unit R.

Figure 7:
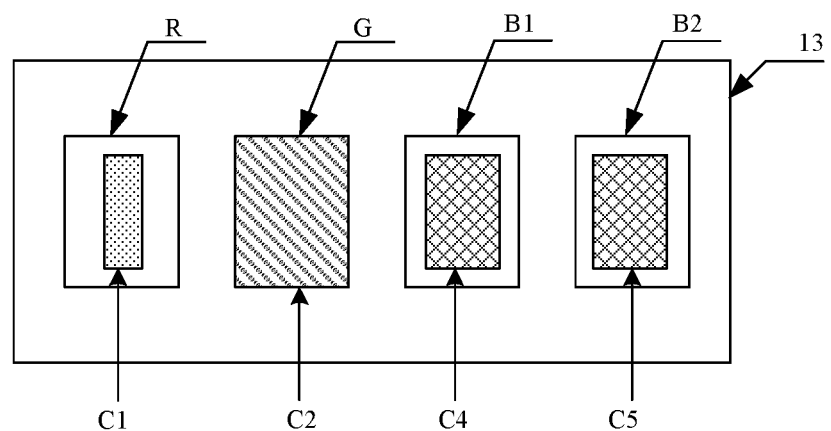
FIG. 7 is a schematic diagram of a structure of another OLED display panel according to an embodiment of the present disclosure.

In the second structure, as human eyes are less sensitive to blue light, the total designated light-emitting area emitting blue light in each pixel region is generally large. Thus, in each pixel region, the total designated light-emitting area emitting blue light may include designated light-emitting areas of two (or more) blue light-emitting units. Optionally, FIG. 7 is a schematic diagram of a structure of yet another display panel provided in an embodiment of the present disclosure. Here, the pixel region 13 has a green light-emitting unit G configured to emit green light, a red light-emitting unit R configured to emit red light, and blue light-emitting units B1 and B2 configured to emit blue light. The area of the light-emitting layer in each light-emitting unit may be equal to the designated light-emitting area in the green light-emitting unit G configured to emit green light (or the ratio of the areas is within the above threshold range), so that an area of the electrode overlapping region C2 (The electrode overlapping region is the electrode overlapping region between the orthographic projections of the two electrodes on the base substrate) in the green light-emitting unit G is equal to the area of the light-emitting layer in the green light-emitting unit G.

In addition, the area of the light-emitting layer in each light-emitting unit may also be greater than the designated light-emitting area of the green light-emitting unit, which is not limited in the embodiments of the present disclosure.

In the third structure, as human eyes are highly sensitive to red light, the total designated light-emitting area configured to emit red light in each pixel region is generally small. Thus, two adjacent pixel regions may share one light-emitting layer configured to emit red light.

Figure 8:
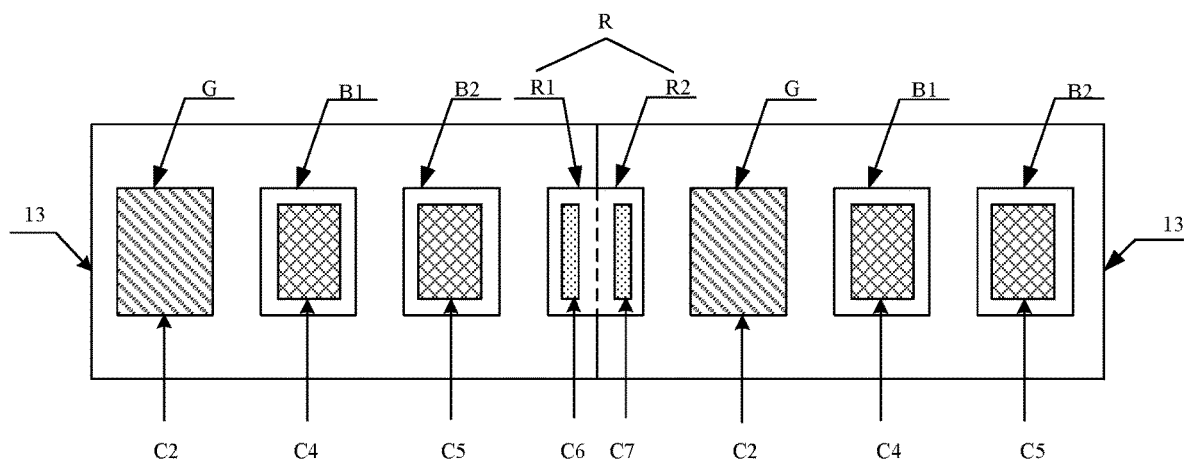
FIG. 8 is a schematic diagram of a structure of yet another OLED display panel according to an embodiment of the present disclosure.

FIG. 8 is a schematic diagram of a structure of still yet another display panel provided in an embodiment of the present disclosure. FIG. 8 shows the structure of another pixel region 13. Here, the base substrate may include a plurality of groups of pixel regions. In FIG. 8, a group of pixel regions is illustrated as an example. Each group of pixel regions include two adjacent pixel regions 13.

Each of the two pixel regions 13 has a green light-emitting unit G configured to emit green light and a blue light-emitting unit B configured to emit blue light. In addition, a red light-emitting unit R configured to emit red light is further disposed in the two pixel regions 13. The red light-emitting unit R includes two red light-emitting sub-units (i.e., a red light-emitting sub-unit R1 and a red light-emitting sub-unit R2) which are disposed in the two pixel regions 13, respectively. The light-emitting layers in the red sub-lighting units R1 and R2 directly contact with each other. That is, the two red light-emitting sub-units share one light-emitting layer.

Optionally, the area of the light-emitting layer in each light-emitting unit may be equal to the designated light-emitting area of the green light-emitting unit G configured to emit green light (or the ratio of the areas is within the above threshold range), so that an area of the electrode overlapping region C2 (The electrode overlapping region is the electrode overlapping region between the orthographic projections of the two electrodes on the base substrate) in the green light-emitting unit G is equal to the area of the light-emitting layer in the green light-emitting unit G. Here, the areas of the electrode overlapping region C4 of the blue light-emitting unit B1 and the electrode overlapping region C5 of the blue light-emitting unit B2 are smaller than the areas of the light-emitting layers in the blue light-emitting units B1 and B2, respectively. The sum of an area of an electrode overlapping region C6 of the red light-emitting sub-unit R1 and an area of an electrode overlapping region C7 of the red light-emitting sub-unit R2 is smaller than an area of the light-emitting layer in the red light-emitting unit R.

By enabling the two adjacent pixel regions to share one red light-emitting unit, Pixels Per Inch (PPI) of pixels disposed on the base substrate increase, and meanwhile approximately equal areas of the light-emitting layers in the light-emitting units formed on the base substrate are ensured.

Optionally, in the embodiments of the present disclosure, the first electrode and the second electrode may serve as a cathode and an anode of the OLED, respectively. The structures of the two electrodes may be implemented in the following three manner.

Figure 9:
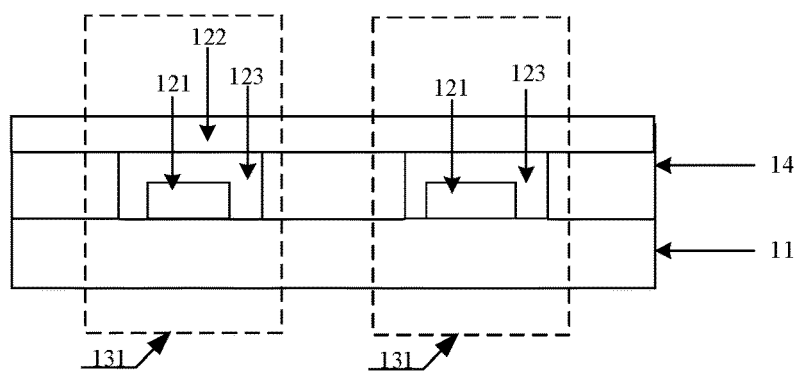
FIG. 9 is a schematic diagram of structures of two electrodes according to an embodiment of the present disclosure.

In the first manner, the second electrodes of plurality of light-emitting units on the base substrate directly contact with each other (that is, the second electrodes may be an entire electrode layer), and first electrodes of the plurality of light-emitting units may include a first electrode pattern including a plurality of first electrodes, formed by a patterning process. When the projection region of the first electrode pattern of plurality of light-emitting units on the base substrate is within the projection region of the second electrodes on the base substrate, the electrode overlapping region of the two electrodes is the projection region of the first electrode pattern on the base substrate. In this case, the electrode overlapping region of the two electrodes can be determined according to the first electrode pattern. Exemplarily, FIG. 9 is a schematic diagram of a structure of still yet another display panel provided in an embodiment of the present disclosure. Here, the second electrodes 122 directly contact with each other, and the first electrodes 121 may include a first electrode pattern which is formed by a patterning process and includes a plurality of first electrodes 121. The electrode overlapping region of the two electrodes can be determined according to the first electrode pattern of the plurality of first electrodes 121. Optionally, the first electrode may serve as an anode which may be made of indium tin oxide (ITO), and correspondingly, the second electrode serves as a cathode.

Figure 10:
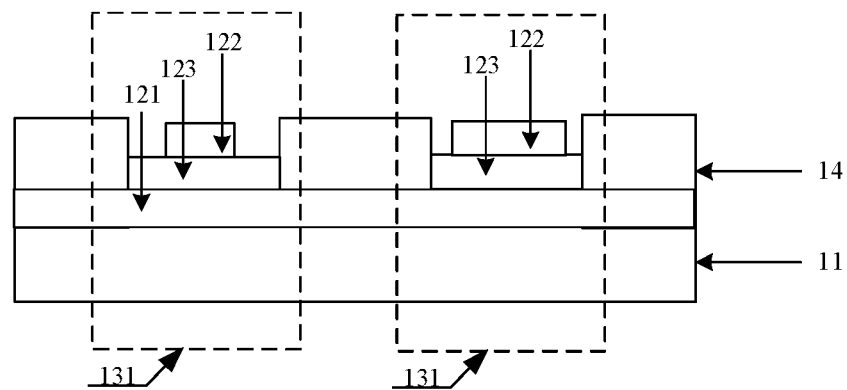
FIG. 10 is a schematic diagram of structures of another two electrodes according to an embodiment of the present disclosure.

In the second manner, the first electrodes of plurality of light-emitting units on the base substrate directly contact with each other, and the second electrodes of the plurality of light-emitting units may include a second electrode pattern formed by a patterning process and including a plurality of second electrodes. Similar to the first manner, in this case, the electrode overlapping region of the two electrodes can be determined according to the second electrode pattern. Exemplarily, FIG. 10 is a schematic diagram of a structure of still yet another display panel provided in an embodiment of the present disclosure. In FIG. 10, the first electrodes 121 directly contact with each other, and the second electrodes 122 may include a second electrode pattern formed by a patterning process and including a plurality of second electrodes 122. The electrode overlapping region of the two electrodes can be determined according to the second electrode pattern of the plurality of second electrodes 122.

In the third manner, the first electrodes of plurality of light-emitting units on the base substrate may include a first electrode pattern formed by a patterning process and including a plurality of first electrodes, and the second electrodes of the plurality of light-emitting units may also include a second electrode pattern formed a the patterning process and including a plurality of second electrodes. The first electrode pattern including the plurality of first electrodes and the second electrode pattern including the plurality of second electrodes may be of the same shape, and may also be of different shapes. In this case, the electrode overlapping region between the projection region of the first electrode pattern on the base substrate and the projection region of the second electrode pattern on the base substrate can be determined as the electrode overlapping region between the two electrodes. Exemplarily, referring to FIG. 4, the first electrodes 121 include a first electrode pattern of the plurality of first electrodes 121, and the second electrodes 122 include a second electrode pattern of the plurality of second electrodes 122. The electrode overlapping region between the projection region of the first electrode pattern on the base substrate 11 and the projection region of the second electrode pattern on the base substrate 11 is determined as the electrode overlapping region between the two electrodes.

In addition, the materials of the first electrode and the second electrode may be correspondingly selected according to the type (for example, a single-side light-transmitting type or the double-side light-transmitting type) of the OLED display panel. When the OLED display panel is a single-side light-transmitting display panel, at least one of the first electrode and the second electrode is made of a transparent conductive material. That is, the first electrodes of plurality of light-emitting units are made of a transparent conductive material. Alternatively, the second electrodes of plurality of light-emitting units are made of a transparent conductive material. When the OLED display panel is a double-side light-transmitting display panel, both the first electrode and the second electrode are made of the transparent conductive material.

In summary, the embodiment of the present disclosure provides an OLED display panel. It is ensured that the light-emitting layers in the light-emitting units have the similar volatilization speed by enabling the areas of the light-emitting layers in plurality of light-emitting units to be approximate. Thus, the present disclosure solves the problem in the related art that the uniformity of the light-emitting layers in the light-emitting units emitting different color light is poorer due to different volatilization speed of the different light-emitting layers, to cause poor uniformity of light emitted by the light-emitting units emitting different color light, and improves the uniformity of the light-emitting layers in the light-emitting units emitting different color light, thereby improving the uniformity of light emitted by the light-emitting units emitting different color light.

Figure 11:
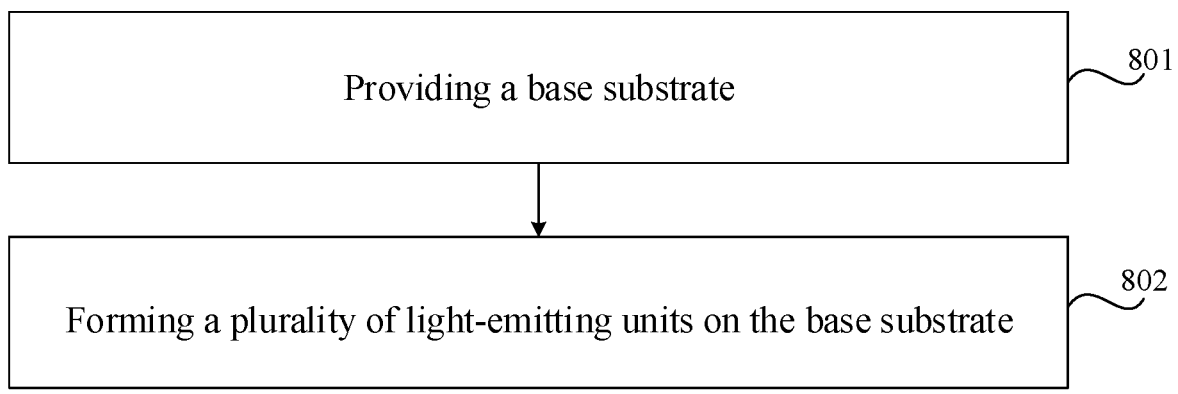
FIG. 11 is a flow chart of a manufacturing method of an OLED display panel according to an embodiment of the present disclosure.

FIG. 11 is a flow chart of a manufacturing method of an OLED display panel provided in an embodiment of the present disclosure. The method may include the following steps.

In step 801, a base substrate is provided.

The base substrate may be a substrate for carrying varied structures in the OLED display panel, such as a glass substrate or a polyimide substrate, and is not limited in the embodiments of the present disclosure.

In step 802, a plurality of light-emitting units are formed on the base substrate.

Each light-emitting unit includes a first electrode, a second electrode, and a light-emitting layer formed between the first electrode and the second electrode. A ratio of areas of the light-emitting layers in the plurality of light-emitting units is within a threshold range. An electrode overlapping region exists between an orthographic projection of the first electrode on the base substrate and an orthographic projection of the second electrode on the base substrate.

In summary, the embodiment of the present disclosure provides a manufacturing method of the OLED display panel. It is ensured that the light-emitting layers in the light-emitting units have the similar volatilization speed by enabling the areas of the light-emitting layers in the plurality of light-emitting units to be approximate. Thus, the present disclosure solves the problem in the related art that the uniformity of the light-emitting layers in the light-emitting units emitting different color light is poorer due to different volatilization speed of the different light-emitting layers, to cause poor uniformity of light emitted by the light-emitting units emitting different color light, and improves the uniformity of the light-emitting layers in the light-emitting units emitting different color light, thereby improving the uniformity of light emitted by the light-emitting units emitting different color light.

Figure 12:
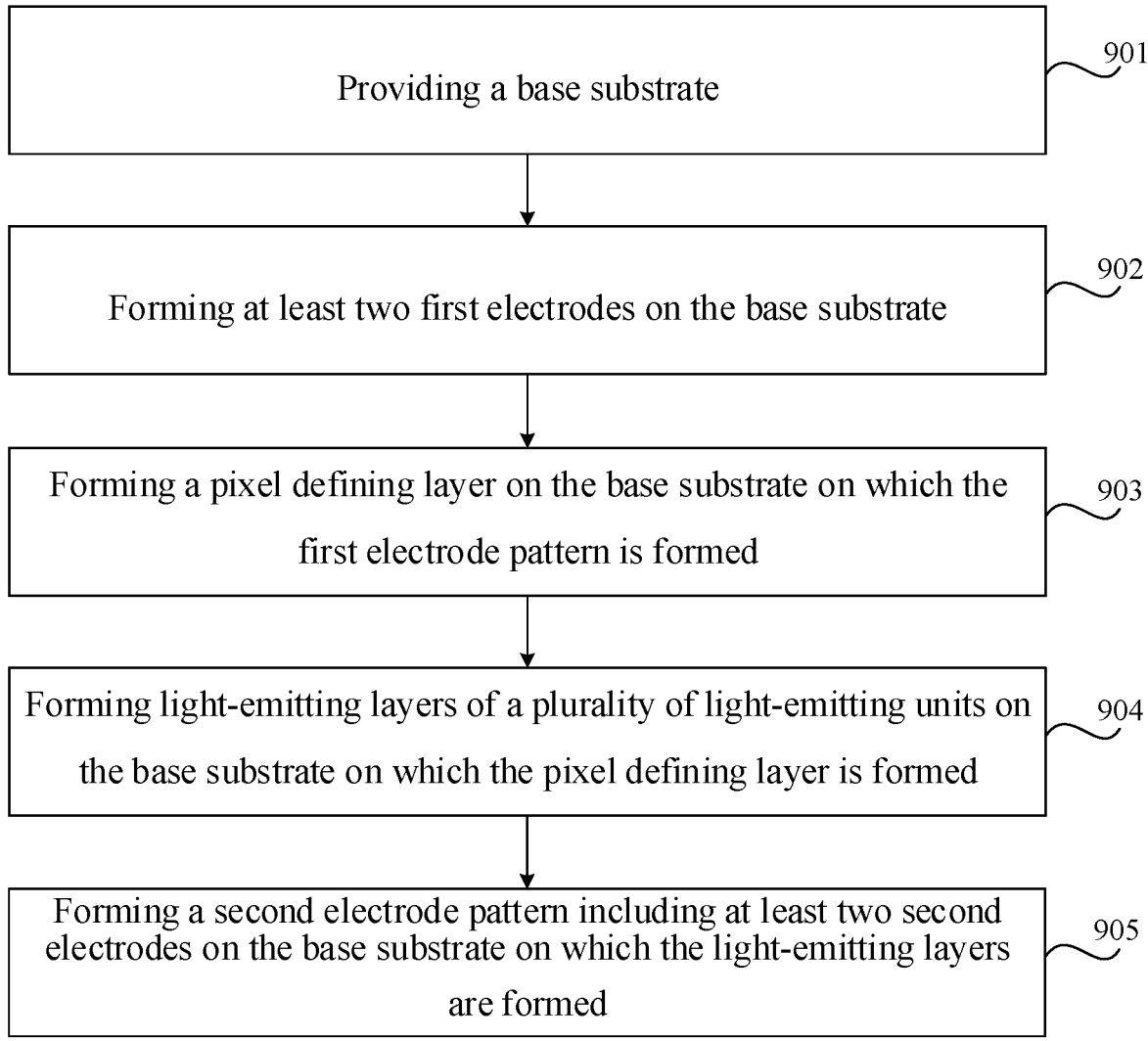
FIG. 12 is a flow chart of a manufacturing method of another OLED display panel according to an embodiment of the present disclosure.

FIG. 12 shows a manufacturing method of another OLED display panel provided in an embodiment of the present disclosure. The method includes the following steps.

In step 901, a base substrate is provided.

In step 902, at least two first electrodes are formed on the base substrate.

Optionally, a first electrode pattern including at least two first electrodes may be formed on the base substrate by a patterning process, wherein the patterning process may include photoresist coating, photoresist exposure, developing, etching, photoresist stripping, and the like.

Figure 13:
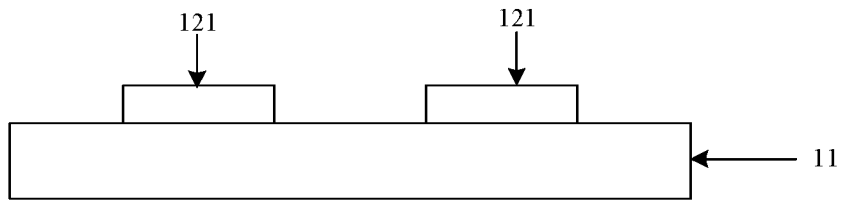
FIG. 13 is a schematic diagram of a structure of a base substrate in the manufacturing method shown in FIG. 12.

Exemplarily, FIG. 13 is schematic diagram of a structure of the base substrate at the end of step 902. Here, a first electrode pattern including two first electrodes 121 is formed on the base substrate 11 by the patterning process.

In an implementation, an electrode layer may be formed on the base substrate in this step. The electrode layer forms at least two first electrodes. The structure of the electrode layer may be made reference to that of the first electrode 121 in FIG. 10, and details are repeated herein.

In step 903, a pixel defining layer is formed on the base substrate on which the first electrode pattern is formed.

Optionally, a pixel defining layer may be formed on the base substrate on which the plurality of first electrodes is formed by a patterning process. The pixel defining layer may define at least two sub-pixel regions having an equal area on the base substrate.

Figure 14:
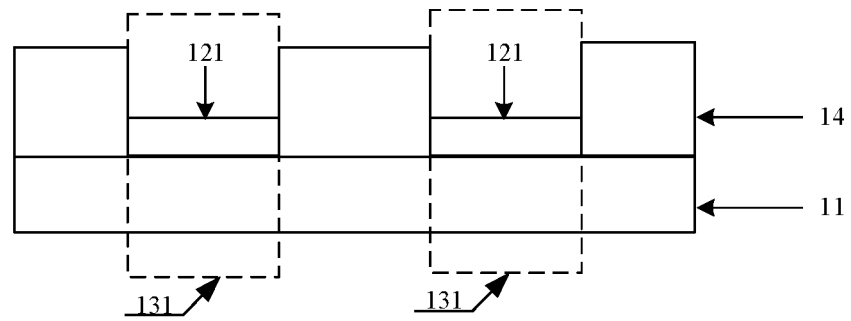
FIG. 14 is a schematic diagram of a structure of another base substrate in the manufacturing method shown in FIG. 12.

Exemplarily, FIG. 14 is schematic diagram of a structure of the base substrate at the end of step 903. Here, the pixel defining layer 14 is formed on the base substrate 11 on which two first electrodes 121 are formed by a patterning process, and the pixel defining layer 14 defines two sub-pixel regions 131 having an equal area on the base substrate 11.

In step 904, light-emitting layers of the plurality of light-emitting units are formed on the base substrate on which the pixel defining layer is formed.

The light-emitting layers of the plurality of light-emitting units are formed in the at least two sub-pixel regions having the equal area in a one-to-one correspondence manner. Optionally, the light-emitting layers of the plurality of light-emitting units are formed on the base substrate on which the pixel defining layer is formed by using the ink-jet printing technology.

Figure 15:
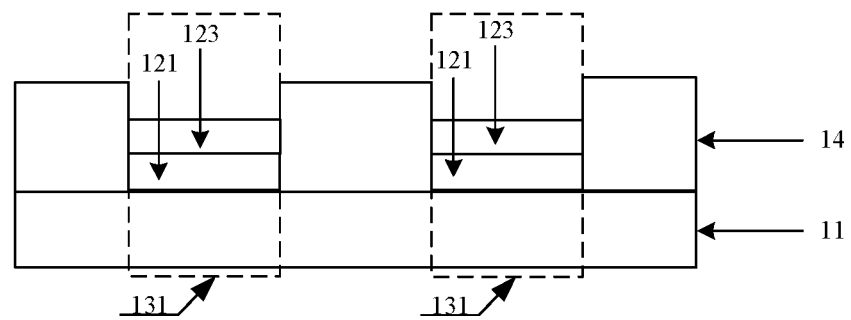
FIG. 15 is a schematic diagram of a structure of yet another base substrate in the manufacturing method shown in FIG. 12.

Exemplarily, FIG. 15 is schematic diagram of a structure of the base substrate at the end of step 904. Here, the light-emitting layers 123 are formed in the two sub-pixel regions 131 by using the ink-jet printing technology.

In step 905, a second electrode pattern including at least two second electrodes is formed on the base substrate on which the light-emitting layers are formed.

Optionally, similar to step 902, the second electrode pattern including at least two second electrodes may be formed on the base substrate on which the light-emitting layers are formed by a patterning process.

Figure 16:
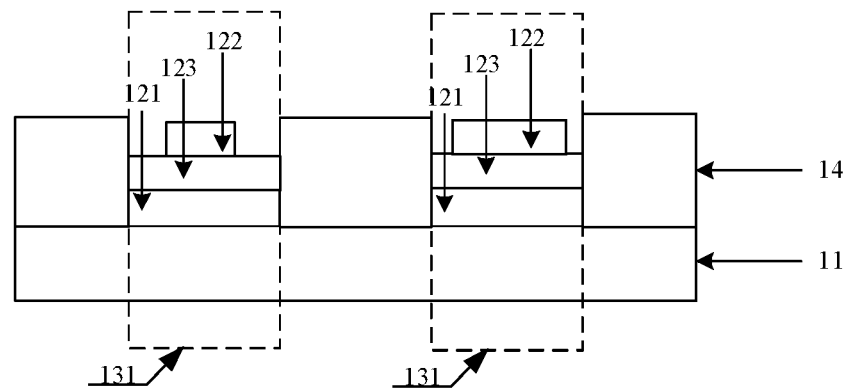
FIG. 16 is a schematic diagram of a structure still yet another base substrate in the manufacturing method shown in FIG. 12.

Exemplarily, FIG. 16 is schematic diagram of a structure of the base substrate at the end of step 905. Here, a second electrode pattern including two second electrodes 122 is formed on the base substrate 11 on which the light-emitting layers 123 are formed by a patterning process.

In summary, the embodiment of the present disclosure provides a manufacturing method of the OLED display panel. It is ensured that the light-emitting layers in the light-emitting units have the similar volatilization speed by enabling the areas of the light-emitting layers in the plurality of light-emitting units to be approximate. Thus, the present disclosure solves the problem in the related art that the uniformity of the light-emitting layers in the light-emitting units emitting different color light is poorer due to different volatilization speed of the different light-emitting layers, to cause poor uniformity of light emitted by the light-emitting units emitting different color light, and improves the uniformity of the light-emitting layers in the light-emitting units emitting different color light, thereby improving the uniformity of light emitted by the light-emitting units emitting different color light.

An embodiment of the present disclosure further provides a display device, which includes any one of the OLED display panels provided in the above embodiments.

It should be pointed out that in the drawings, the dimensions of layers and regions may be exaggerated for the clarity of illustration. It can also be understood that when an element or a layer is referred to as "on" another element or layer, the element or layer may be directly arranged on the other element, or there may be an intermediate layer. In addition, it can be understood that when an element or a layer is referred to as "under" another element or layer, the element or layer may be directly arranged under the other element, or there may be more than one intermediate layer or element. Moreover, understandably, when a layer or an element is referred to as being "between" two layers or two elements, the layer or element may be the only one layer between the two layers or the two elements, or there may be more than one intermediate layers or elements. Similar reference numerals indicate similar elements throughout the text.

The terms "first", "second", and "third" used in the present disclosure is merely intended for description and cannot be construed as denoting or implying any relative importance. The term "a plurality of" means two or more, unless otherwise expressly specified.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An organic light-emitting diode display panel, comprising:
   a base substrate, and
   a plurality of light-emitting units; wherein
   the plurality of light-emitting units are on the base substrate; each of the light-emitting units comprises a first electrode, a second electrode, and a light-emitting layer between the first electrode and the second electrode; a ratio of areas of light-emitting layers in at least two of the plurality of light-emitting units is within a threshold range; and an electrode overlapping region exists between an orthographic projection of the first electrode on the base substrate and an orthographic projection of the second electrode on the base substrate, and electrode overlapping region is within an orthographic projection of the light-emitting layer on the base substrate,
   wherein the base substrate comprises a plurality of pixel regions; and each of the pixel region comprises three sub-pixel regions, wherein a blue light-emitting unit configured to emit blue light, a green light-emitting unit configured to emit green light, and a red light-emitting unit configured to emit red light are disposed in the three sub-pixel regions, respectively; and wherein an area of an electrode overlapping region of the green light-emitting unit is smaller than an area of a light-emitting layer in the green light-emitting unit;

an area of an electrode overlapping region of the blue light-emitting unit is equal to an area of a light-emitting layer in the blue light-emitting unit; and an area of an electrode overlapping region of the red light-emitting unit is smaller than an area of a light-emitting layer in the red light-emitting unit.

2. The organic light-emitting diode display panel of claim 1, wherein the area of the electrode overlapping region of the green light-emitting unit is greater than the area of the electrode overlapping region of the red light-emitting unit.

3. The organic light-emitting diode display panel of claim 1, wherein the threshold range is [0.65, 1.35].

4. The organic light-emitting diode display panel of claim 1, wherein areas of light-emitting layers in the at least two of the plurality of light-emitting units in the organic light-emitting diode display panel are equal.

5. The organic light-emitting diode display panel of claim 1, wherein each of the plurality of light-emitting units corresponds to a designated light-emitting area; and an electrode overlapping area of any one light-emitting unit of the plurality of light-emitting units is equal to the designated light-emitting area that the any one light-emitting unit corresponds to.

6. The organic light-emitting diode display panel of claim 1, further comprising: a pixel defining layer, wherein the pixel defining layer is on the base substrate, and defines at least two sub-pixel regions having an equal area on the base substrate; and the light-emitting layers of the plurality of light-emitting units are in the at least two sub-pixel regions having the equal area in a one-to-one correspondence manner.

7. The organic light-emitting diode display panel of claim 1, wherein the first electrodes of the plurality of light-emitting units directly contact with each other.

8. The organic light-emitting diode display panel of claim 1, wherein the second electrodes of the plurality of light-emitting units are of an integrated structure.

9. The organic light-emitting diode display panel of claim 1, wherein at least one kind of the first electrodes and second electrodes of the plurality of light-emitting units are made of a transparent conductive material.

10. The organic light-emitting diode display panel of claim 1, wherein
areas of the light-emitting layers in the at least two of the plurality of light-emitting units in the organic light-emitting diode display panel are equal;
the organic light-emitting diode display panel further comprises a pixel defining layer, wherein the pixel defining layer is on the base substrate and defines at least two sub-pixel regions having an equal area on the base substrate, and the light-emitting layers of the plurality of light-emitting units are in the at least two sub-pixel regions having the equal area in a one-to-one correspondence manner; and
the first electrodes of the plurality of light-emitting units directly contact with each other;
at least one kind of the first electrodes and second electrodes of the plurality of light-emitting units are made of a transparent conductive material.

11. A manufacturing method of an organic light-emitting diode display panel, comprising:
providing a base substrate; and
forming a plurality of light-emitting units on the base substrate, wherein each of the light-emitting units comprises a first electrode, a second electrode, and a light-emitting layer formed between the first electrode and the second electrode, a ratio of areas of the light-emitting layers in the plurality of light-emitting units is within a threshold range, and an electrode overlapping region exists between an orthographic projection of the first electrode on the base substrate and an orthographic projection of the second electrode on the base substrate, and the electrode overlapping region is within an orthographic projection of the light-emitting layer on the base substrate;
wherein the base substrate comprises a plurality of pixel regions; and each of the pixel region comprises three sub-pixel regions, wherein a blue light-emitting unit configured to emit blue light, a green light-emitting unit configured to emit green light, and a red light-emitting unit configured to emit red light are disposed in the three sub-pixel regions, respectively; and
wherein an area of an electrode overlapping region of the green light-emitting unit is smaller than an area of a light-emitting layer in the green light-emitting unit;
an area of an electrode overlapping region of the blue light-emitting unit is equal to an area of a light-emitting layer in the blue light-emitting unit; and
an area of an electrode overlapping region of the red light-emitting unit is smaller than an area of a light-emitting layer in the red light-emitting unit.

12. The method of claim 11, wherein forming a plurality of light-emitting units on the base substrate comprises:
forming at least two first electrodes on the base substrate;
forming a pixel defining layer on the base substrate on which the at least two first electrodes are formed, wherein the pixel defining layer defines at least two sub-pixel regions having an equal area on the base substrate;
forming light-emitting layers of the plurality of light-emitting units on the base substrate on which the pixel defining layer is formed, wherein the light-emitting layers of the plurality of light-emitting units are formed in the at least two sub-pixel regions having the equal area in a one-to-one correspondence manner; and
forming at least two second electrodes on the base substrate on which the light-emitting layers are formed.

13. The method of claim 12, wherein forming the at least two first electrodes on the base substrate comprises:
forming an electrode layer on the base substrate, wherein the electrode layer forms the at least two first electrodes.

14. The method of claim 12, wherein forming the light-emitting layers of the plurality of light-emitting units on the base substrate on which the pixel defining layer is formed comprises:
forming the light-emitting layers of the plurality of light-emitting units on the base substrate on which the pixel defining layer is formed by using the ink-jet printing technology.

15. A display device, comprising an organic light-emitting diode display panel, wherein the organic light-emitting diode display panel comprises:
a base substrate; and
a plurality of light-emitting units; wherein
the plurality of light-emitting units are on the base substrate; each of the light-emitting units comprises a first electrode, a second electrode, and a light-emitting layer between the first electrode and the second electrode; a ratio of areas of the light-emitting layers in the plurality of light-emitting units is within a threshold range; and an electrode overlapping region exists between an orthographic projection of the first electrode on the base substrate and an orthographic projection of the second electrode on the base substrate, and the electrode overlapping region is in an orthographic projection of the light-emitting layer on the base substrate;

wherein the base substrate comprises a plurality of pixel regions; and each of the pixel region comprises three sub-pixel regions, wherein a blue light-emitting unit configured to emit blue light, a green light-emitting unit configured to emit green light, and a red light-emitting unit configured to emit red light are disposed in the three sub-pixel regions, respectively; and wherein an area of an electrode overlapping region of the green light-emitting unit is smaller than an area of a light-emitting layer in the green light-emitting unit;

an area of an electrode overlapping region of the blue light-emitting unit is equal to an area of a light-emitting layer in the blue light-emitting unit; and an area of an electrode overlapping region of the red light-emitting unit is smaller than an area of a light-emitting layer in the red light-emitting unit.

* * * * *